United States Patent
Kim

(10) Patent No.: US 8,013,810 B2
(45) Date of Patent: Sep. 6, 2011

(54) SCAN DRIVING CIRCUIT, ELECTROLUMINESCENT DISPLAY HAVING THE SAME

(75) Inventor: Mihae Kim, Yongin-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 943 days.

(21) Appl. No.: 11/976,078

(22) Filed: Oct. 19, 2007

(65) Prior Publication Data

US 2008/0170029 A1  Jul. 17, 2008

(30) Foreign Application Priority Data

Jan. 15, 2007 (KR) .................. 10-2007-0004431

(51) Int. Cl.
*G09G 3/30* (2006.01)

(52) U.S. Cl. ........................................ 345/76; 345/100

(58) Field of Classification Search .................. 345/76, 345/98, 99, 100, 204; 327/57
See application file for complete search history.

(56) References Cited

U.S. PATENT DOCUMENTS

| | | | | |
|---|---|---|---|---|
| 5,128,974 A | * | 7/1992 | Maekawa | 377/81 |
| 5,384,496 A | * | 1/1995 | Tanaka | 327/94 |
| 6,438,023 B1 | * | 8/2002 | Johnson | 365/154 |
| 7,345,518 B2 | * | 3/2008 | Branch et al. | 327/203 |
| 7,420,402 B2 | * | 9/2008 | Washio et al. | 327/208 |
| 7,522,160 B2 | * | 4/2009 | Moon | 345/204 |
| 7,586,485 B2 | * | 9/2009 | Teshirogi et al. | 345/204 |
| 2004/0160852 A1 | * | 8/2004 | Sasagawa | 365/233 |
| 2006/0125762 A1 | * | 6/2006 | Fujita | 345/98 |
| 2006/0152459 A1 | * | 7/2006 | Shin | 345/94 |
| 2007/0236421 A1 | * | 10/2007 | Shin | 345/76 |

FOREIGN PATENT DOCUMENTS

KR  10-2005-0122688 A   12/2005

* cited by examiner

*Primary Examiner* — Chanh Nguyen
*Assistant Examiner* — Pegeman Karimi
(74) *Attorney, Agent, or Firm* — Lee & Morse, P.C.

(57) ABSTRACT

A scan driver may include first signal processor adapted to receive an initializing signal, a base clock signal, a base negative clock signal and a feedback signal, and to generate a first output signal, a second signal processor adapted to receive the initializing signal, the first output signal, the base clock signal and the base negative clock signal, and to generate a second output signal and a second negative output signal, a first logic gate adapted to receive the base clock signal and the second output signal, and to generate a first clock signal, and a second logic gate adapted to receive the base clock signal and the second negative output signal, and to generate a second clock signal.

22 Claims, 5 Drawing Sheets

SCAN DRIVING CIRCUIT, ELECTROLUMINESCENT DISPLAY HAVING THE SAME

The present application claims priority from Korean Application No. 10-2007-0004431 filed Jan. 15, 2007, the content of which is hereby incorporated by reference into this application

BACKGROUND OF THE INVENTION

1. Field of the Invention

Embodiments of the present invention relate to a scan driver and a method for driving a display, and an electroluminescent (EL) display including the scan driver. More particularly, embodiments relate to a scan driver and method for driving a display, and an EL display including the scan driver in which a reduced number of clock signals are input to terminals of the scan driver.

2. Description of the Related Art

Generally, a conventional EL display emits light by electrically exciting fluorescent or phosphorescent materials. An organic EL display may drive N×M number of organic EL cells so as to display an image. The organic EL cell may include an anode, e.g., made of a transparent conductive material such as indium tin oxide (ITO), an organic thin film and a cathode, e.g., made of an opaque conductive material, such as metal. The organic thin film may have a multi-layered structure including an emitting layer (EML) for emitting light by combing an electron and a hole, an electron transport layer (ETL) for transporting the electron and a hole transport layer (HTL) for transporting the hole. Further, the organic thin film may include an electron injecting layer (EIL) for injecting the electron and a hole injecting layer (HIL) for injecting the hole.

Driving techniques for the organic EL cell may include a passive matrix (PM) technique and an active matrix (AM) technique. The PM technique refers to a driving technique in which lines of anodes and cathodes orthogonal to each other may be selected to drive light emission cells. The AM technique refers to a driving technique in which each emission cell may be driven by a thin film transistor (TFT) via external signals stored in a capacitor. The AM technique may include a voltage programming technique and a current programming technique according to a signal form applied to maintain a voltage in the capacitor.

Recently, various kinds of light-weight, small-sized light emitting displays have been developed. Organic EL displays may be employed in mobile communication terminals, navigation devices, personal display assistances (PDAs), camcorders, and so forth. For such applications, an organic EL display having a high light emitting efficiency, high luminance, a wide viewing angle, a high resolution, a high response speed and a reduced thickness may be employed. The AM technique may provide better luminance and lower power consumption than the PM technique.

Scan drivers of organic EL displays may employ a latch scan circuit using two clock signals to prevent a scan signal from being changed due to coupling capacitance. The latch scan circuit may have two input terminals for receiving the two clock signals, thereby increasing the size and the manufacturing cost of an integrated circuit (IC) including the latch scan circuit.

SUMMARY OF THE INVENTION

Embodiments of the present invention are therefore directed to providing a scan driver, a driving method, and an EL display including the scan driver, which substantially overcome one or more of the disadvantages of the related art.

It is therefore a feature of an embodiment of the present invention to provide a scan driver, a driving method, and an EL display including the scan driver that can operate a latch scan driving circuit using a single clock signal to generate two clock signals.

It is therefore another feature of an embodiment of the present invention to provide a scan driver, a driving method, and an EL display including the scan driver that decreases a number of clock input terminals for a latch scan driving circuit to one.

It is therefore yet another feature of an embodiment of the present invention to provide a scan driver, a driving method, and an EL display including the scan driver having decreased integrated circuit size.

It is therefore still another feature of an embodiment of the present invention to provide a scan driver, a driving method, and an EL display including the scan driver having a reduced manufacturing cost.

At least one of the above and other features and advantages of the present invention may be realized by providing a scan driver including a shift register, a first signal processor adapted to receive an initializing signal, a base clock signal, a base negative clock signal and a feedback signal, and to generate a first output signal, a second signal processor adapted to receive the initializing signal, the first output signal, the base clock signal and the base negative clock signal, and to generate a second output signal and a second negative output signal, a first logic gate adapted to receive the base clock signal and the second output signal, and to generate a first clock signal, and a second logic gate adapted to receive the base clock signal and the second negative output signal, and to generate a second clock signal.

The may include a first switching element, the first switching element being electrically coupled to a negative output signal of the shift register via a control electrode, the first switching element being adapted to supply a first power voltage to the first and second signal processors. The scan driver may include a shift inverter adapted to receive the output signal of shift register and to output the negative output signal of the shift register. The first power voltage may be the initializing signal supplied to the first signal processor and the second signal processor. The shift register may be adapted to receive the base clock signal, the base negative clock signal, and the initializing signal, and to output an output signal of the shift register.

The first signal processor may include a first transmission gate adapted to receive the base clock signal and the base negative clock signal, and to transfer the feedback signal to a first inverter, a second transmission gate adapted to receive the base clock signal and the base negative clock signal, and to transfer the output signal of a second inverter to the first inverter, the first inverter adapted to receive the output signal of the first and the second transmission gates, and to generate a first output signal, and the second inverter adapted to invert the first output signal and to transfer an inverted first output signal to the second transmission gate.

The initializing signal may be input to the second inverter. The feedback signal may be the second output signal. The first transmission gate may be on when the base clock signal is high. The second transmission gate may be on when the base clock signal is low.

The second signal processor may include a third transmission gate adapted to receive the base clock signal and the base negative clock signal, and to transfer the first output signal to a third inverter, a fourth transmission gate adapted to receive the base clock signal and the base negative clock signal, and to transfer the feedback signal to the third inverter, the third inverter adapted to receive the output signal of the third and the fourth transmission gate, and to generate the second negative output signal, and the fourth inverter adapted to receive the second negative output signal and to generate the second output signal.

The initializing signal may be an input signal of the third transmission gate. The feedback signal may be the second output signal. The third transmission gate may be on when the base clock signal is high. The fourth transmission gate may be on when the base clock signal is low.

The first and the second clock signals may be input to a latch scan circuit. The latch scan circuit may include first through fifth transistors, wherein the first transistor is adapted to transfer an input signal of the latch scan circuit to control electrodes of the second and fourth transistors in accordance with the first clock signal, the second transistor is adapted to transfer the second clock signal to an output signal of the latch scan circuit in accordance with an output signal of the first transistor, the third transistor adapted to transfer a second power voltage to the fifth transistor in accordance with the first clock signal, the fourth transistor is adapted to transfer the first clock signal to a control electrode of the fifth transistor in accordance with an output signal of the first transistor, and the fifth transistor is adapted to transfer a first power voltage to the output signal of the latch scan driving circuit in accordance with outputs of the third and the fourth transistors. The output signal of the latch scan circuit may be a scan signal transmitted to a pixel circuit.

The shift register may include a first PMOS switching element adapted to supply a first power voltage in accordance with the base clock signal, a second PMOS switching element adapted to supply the first power voltage from the first PMOS switching element to a first node in accordance with a shift register input signal, a first NMOS switching element adapted to supply a second power voltage in accordance with the base negative clock signal, a second NMOS switching element adapted to supply the second power voltage from the first NMOS switching element to the first node in accordance with the shift register input signal, a third PMOS switching element adapted to supply the first power voltage in accordance with the base negative clock signal, a third NMOS switching element adapted to supply the second power voltage in accordance with the base clock signal, a second node between a fourth PMOS switching element and a fourth NMOS switching element, the fourth PMOS switching element being adapted to transfer the first power voltage from the third PMOS switching element to the first node in accordance with a signal at the second node, and the fourth NMOS switching element being adapted to transfer the second power voltage from the third NMOS switching element to the first node in accordance with the signal at the second node, a fifth PMOS switching element adapted to supply the first power voltage to the second node in accordance with a signal at the first node, and a fifth NMOS switching element adapted to supply the second power voltage to the second node in accordance with the signal at the first node. The second node may be an output signal of the shift register.

The driver may include a clock inverter receiving the primitive clock signal so as to generate the primitive negative clock signal At least one of the above and other features and advantages of the present invention may be realized by providing an electroluminescence display including the scan driver.

At least one of the above and other features and advantages of the present invention may be realized by providing a method of generating first and second clock signals from a single clock signal, the method including generating a first output signal from an initializing signal, a base clock signal, a base negative clock signal and a feedback signal, generating a second output signal and a second negative output signal from the initializing signal, the first output signal, the base clock signal and the base negative clock signal, generating the first clock signal from the base clock signal and the second output signal, and generating the second clock signal from the base clock signal and the second negative output signal.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
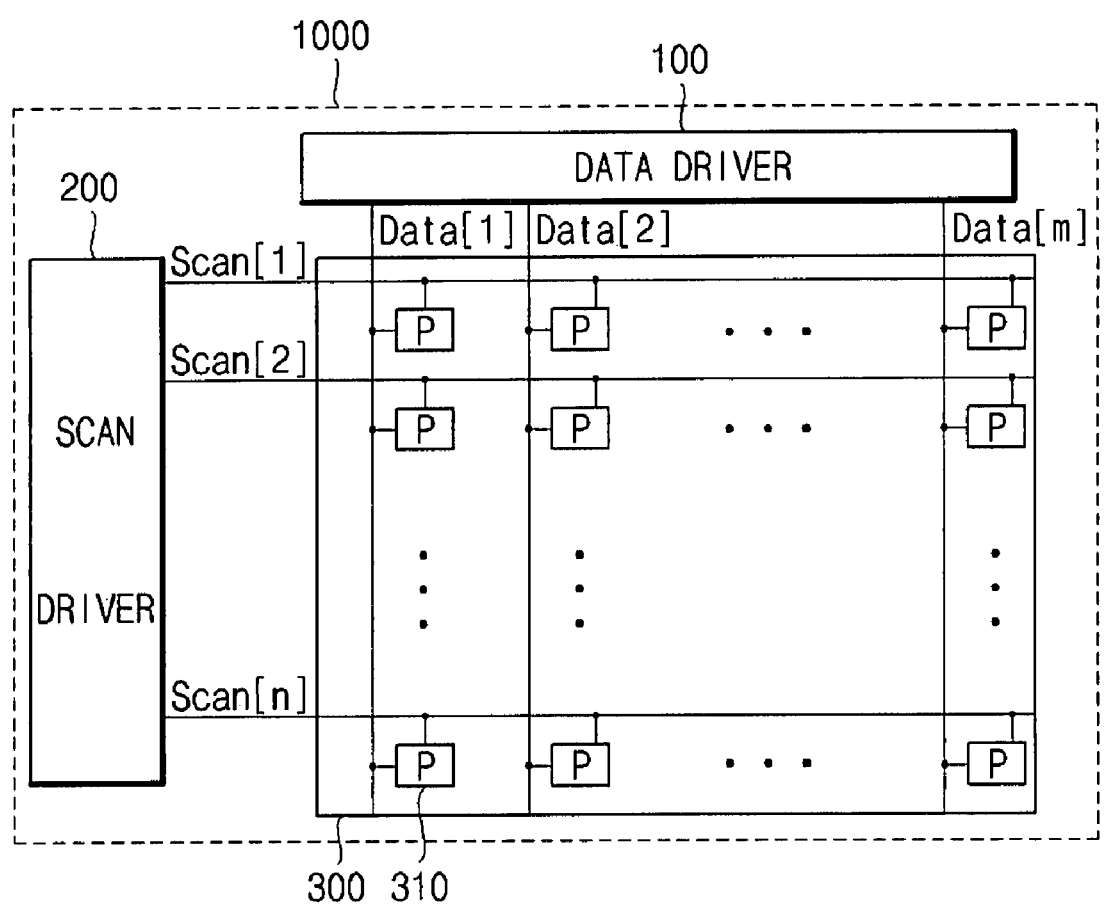
FIG. 1 illustrates a block diagram of an EL display according to an embodiment of the present invention.

Korean Patent Application No. 10-2007-0004431, filed on Jan. 15, 2007, in the Korean Intellectual Property Office (KIPO), and entitled: "Organic Electroluminescence Display and Driving Circuit Thereof," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers or elements may also be present. Further, it will be understood that when a layer or element is referred to as being "under" another layer or substrate, it can be directly under, or one or more intervening layers or elements may also be present. In addition, it will also be understood that when a layer or elements is referred to as being "between" two layers or elements, it can be the only layer or element between the two layers or elements, or one or more intervening layers or elements may also be present. It will further be understood that when an element is referred to as being "coupled" to another element, it can be directly coupled to the other element, or one or more intervening elements may also be present. Like reference numerals refer to like elements throughout.

As will be described in detail below, a scan driver, a driving method, and an organic EL display including the scan driver according to embodiments may produce the following effects. First, the scan driver may generate two clock signals that can operate the latch scan driving circuit from a single clock signal, thereby decreasing a number of clock input terminals, i.e., to one, a size of integrated circuit, and a manufacturing cost. Second, a clock distributor used to generate the two clock signals may be initially driven using the scan driver.

FIG. 1 illustrates a block diagram of an organic EL display 100 according to an embodiment of the present invention. Referring to FIG. 1, the organic EL display 100 may include a scan driver 200, a data driver 120 and an organic EL display panel (hereinafter, referred to as "a panel") 130.

The scan driver 200 may sequentially supply a scan signal to the panel 130 via a scan lines Scan[1], Scan[2], . . . , Scan[n]. The data driver 120 may supply a data signal to the panel 130 via a data lines Data[1], Data[2], . . . , Data[m]. The panel 130 may include a plurality of scan lines Scan[1], Scan[2], . . . , Scan[n] arranged in a column direction, a plurality of data lines Data[1], Data[2], . . . , Data[m] arranged in a row direction, and a pixel circuit 131 at the intersection of the scan lines and the data lines.

The pixel circuit 131 may be in a pixel area P defined by two neighboring scan lines and two neighboring data lines. The panel 130 may supply the first and the second power voltage VDD and VSS (not shown) from the outside to each pixel circuit 131. Each pixel circuit 131 may emit light in accordance with a data signal supplied by a controlling current.

Figure 2:
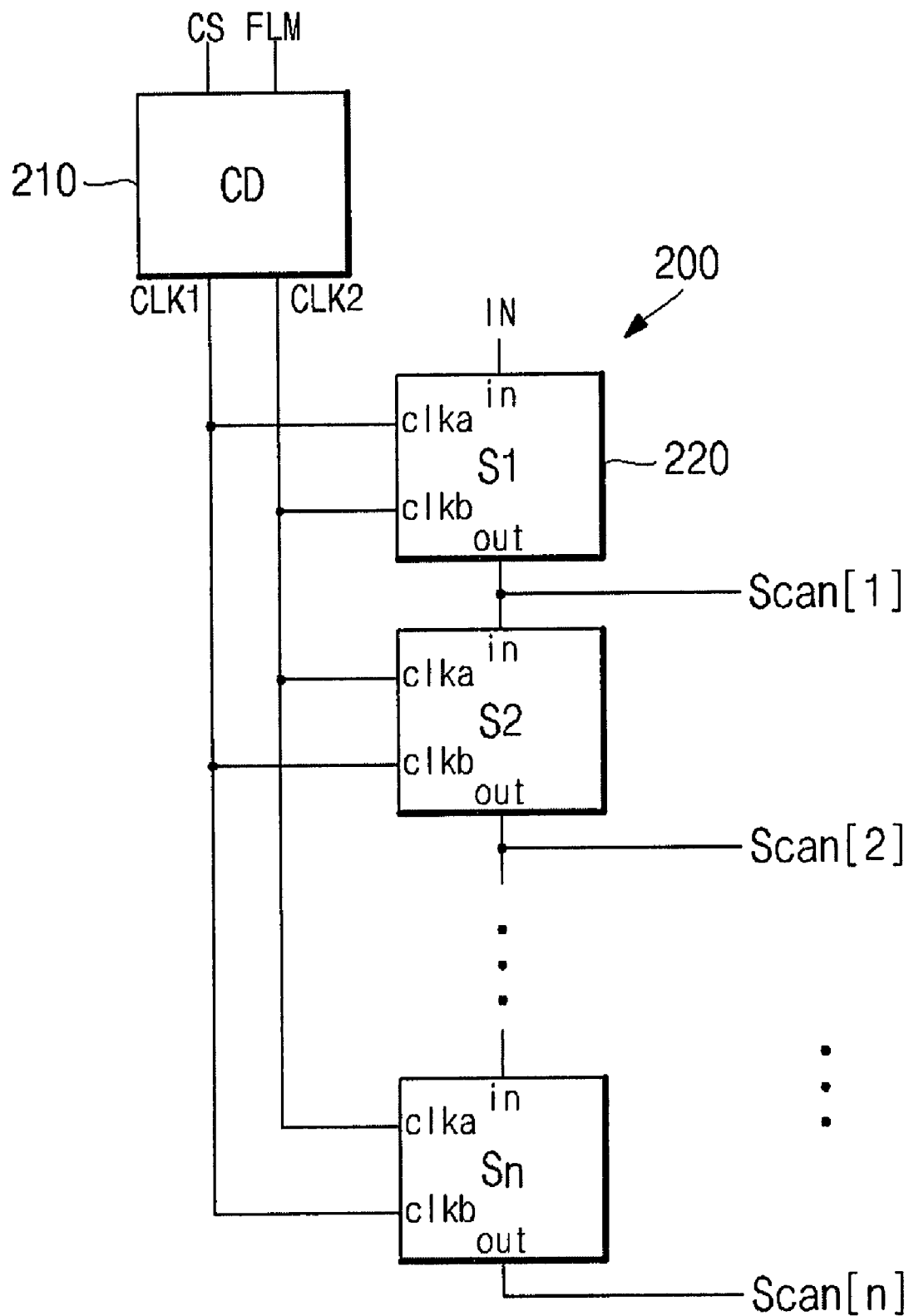
FIG. 2 illustrates a block diagram of a scan driver according to an embodiment of the present invention.

FIG. 2 illustrates a block diagram of the scan driver 200 according to an embodiment of the present invention. Referring to FIG. 2, the scan driver 200 may include a clock distributor (CD) 210 and a plurality of latch scan circuits 220.

The clock distributor CD 210 may receive a base clock signal CS and an initializing driving signal FLM, and may generate first and second signals CLK1 and CLK2. The first and second signals CLK1 and CLK2 may be supplied to the latch scan circuit 220. The first and second signals CLK1 and CLK2 may have may overlap for a predetermined time at the high level, i.e., may both be high for the predetermined time, and may have opposite phases over a remaining portion of the period. The clock distributor CD 210 may generate the first and second signals CLK1 and CLK2 in accordance with only the base clock signal CS, thereby allowing the number of input clock terminals of scan driver 200 to be reduced from two to one, which may allow a number of the input terminals, a size and manufacturing cost of the scan driver 200 all to be reduced.

A number n of the latch scan circuits 220 may sequentially output the scan signal. The number n of latch scan circuits 220 may transfer the scan signal to the panel 130 through the scan lines Scan[1], Scan[2], . . . , Scan[n]. The latch scan circuit 220 may transfer a base input signal as an input signal of a first latch scan circuit, and may transfer an output signal of a previous latch circuit as an input signal for the 2 to an n latch scan circuits. Each latch scan circuit 220 of the scan driver 200 for outputting the scan signal may include first and second clock terminals clka and clkb for receiving the first and second clock signals CLK1 and CLK2. The first clock signal CLK1 may be supplied to the first clock terminal clka of odd number latch scan circuits 220, and the second clock signal CLK2 may be supplied to the second clock terminal clkb thereof. The second clock signal CLK2 may be supplied to the first clock terminal clka of even number latch scan circuits 220, and the first clock signal CLK1 may be supplied to the second clock terminal clkb thereof. In other words, each latch scan circuit 220 may receive the initializing input signal IN or the output signal of the previous stage, the first and second signals CLK1 and CLK2, and may sequentially output the scan signal, e.g., a low level signal, after a period in which the first clock signal CLK1 and the second clock signal CLK2 are both high.

Figure 3:
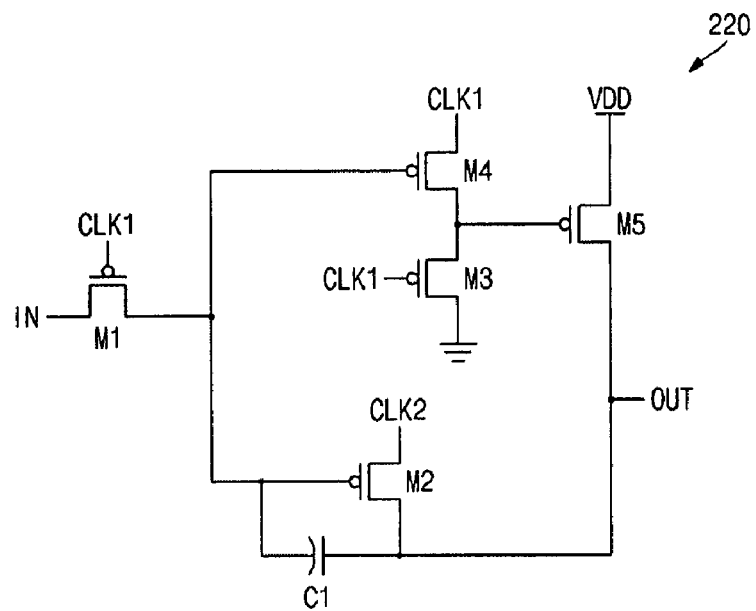
FIG. 3 illustrates a circuit diagram of a latch scan circuit according to an embodiment of the present invention.
Figure 4:
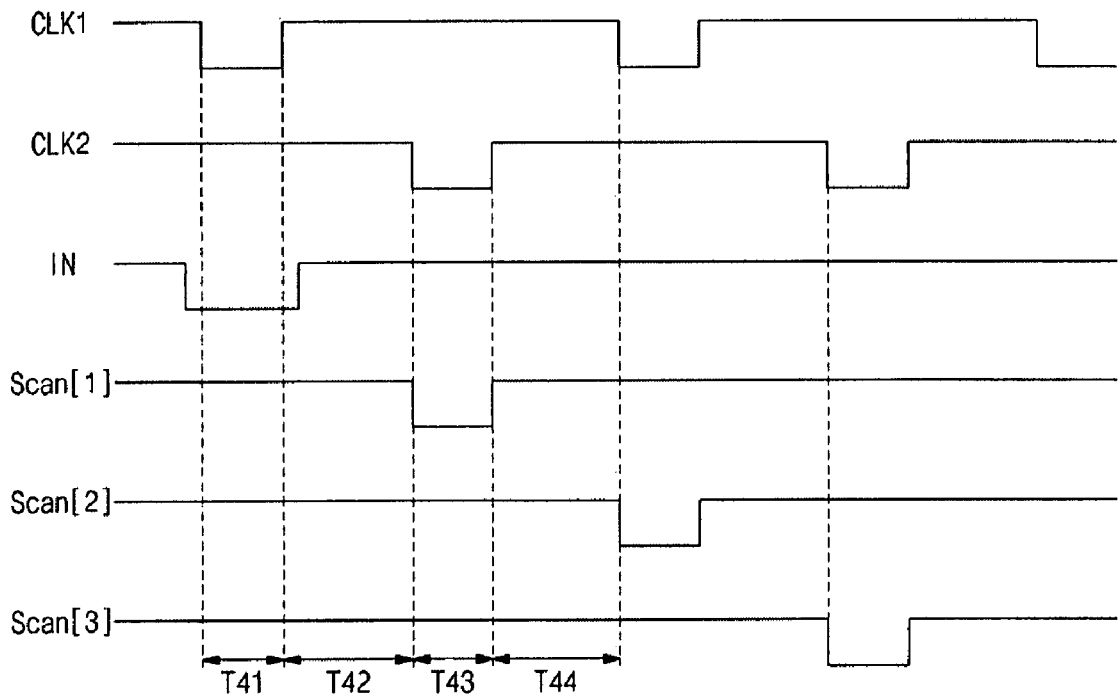
FIG. 4 illustrates a timing diagram of an operation of the latch scan circuit shown in FIG. 3.
Figure 5:
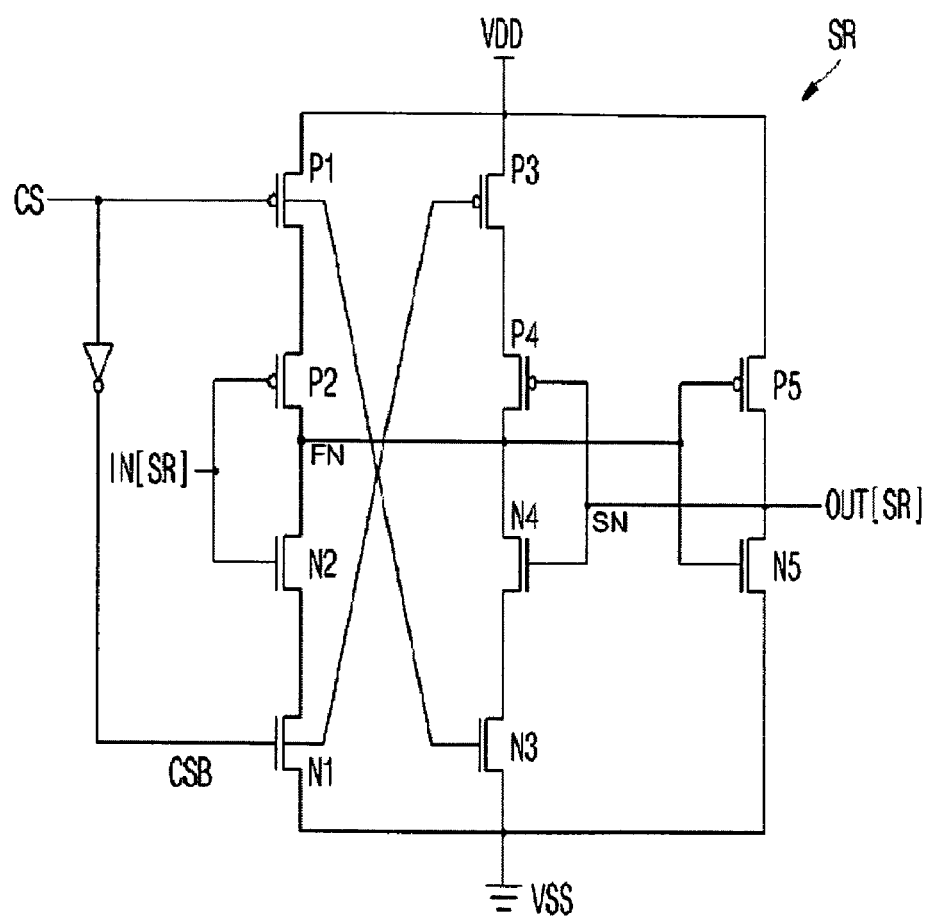
FIG. 5 illustrates a circuit diagram of a shift register according to an embodiment of the present invention.
Figure 6:
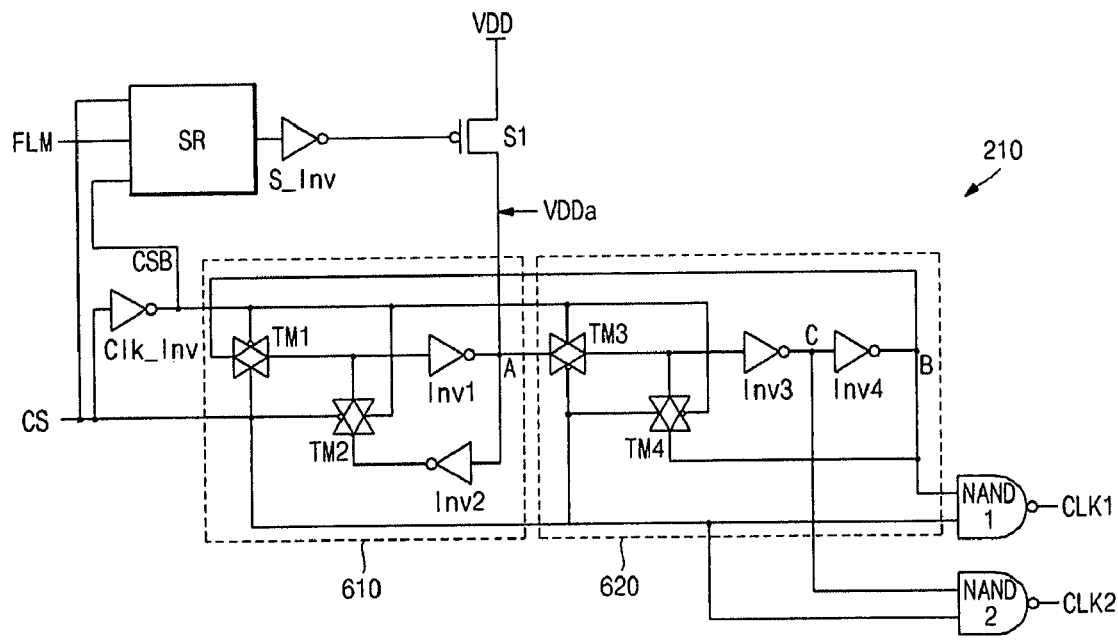
FIG. 6 illustrates a block diagram of a clock distributor according to an embodiment of the present invention.

FIG. 3 illustrates a circuit diagram of the latch scan circuit 220 according to an embodiment of the present invention. FIG. 4 illustrates a timing diagram of the operation of the latch scan circuit 220 shown in FIG. 3. FIG. 6 illustrates a circuit diagram of the clock distributor CD 210 of the scan driver 200. FIG. 5 illustrates a circuit diagram of a shift register SR to be used in the clock distributor CD 210.

Referring to FIG. 3, the latch scan circuit 220 of an embodiment of the present invention, which is assumed to be odd numbered, here the first, latch scan circuit 220, may receive the first clock signal CLK1 at the first clock terminal clka and the second clock signal CLK2 at the second clock terminal clkb. Alternatively, in an even numbered latch scan circuit 220, the second clock signal CLK2 may be supplied to the first clock terminal clka, and the first clock signal CLK1 may be supplied to the second clock terminal clkb. The second power voltage VSS may be a ground voltage, as illustrated in FIG. 3.

Each latch scan circuit 220 may include a first transistor M1, a second transistor M2, a third transistor M3, a fourth transistor M4, a fifth transistor M5, and a capacitive element C1.

As illustrated in FIG. 4, during a precharge period, e.g., a first period T41, the first clock signal CLK1 may be low, the second clock signal CLK2 may be high, and the input signal IN may be low. During an evaluation period, e.g., a third period T43, the first clock signal CLK1 may be high and the second clock signal CLK2 may be low. During the precharge period, a high level may be output to the scan line Scan[1]. During the evaluation period, a signal received during the precharge period, e.g., a low level signal, may be output to the scan line Scan[1].

By sequentially outputting the signal of the low level after a time that the clock signals CLK1 and CLK2 input to each latch circuit 220 from the clock distributor CD 210 overlap, i.e., both are high, in a second period T42 and a fourth period T44, a predetermined time interval between the output signals of each latch scan circuit 220 may be produced, thereby allowing margin for the clock skew or the delay to be assured.

During the precharge period, i.e., the first period T41, when the first clock signal CLK1 is low and the second clock signal CLK2 is high, first and third transistors M1 and M3 may be turned on, such that the input signal IN may be transferred to each control electrode of second and fourth transistors M2 and M4, thereby turning them on. Consequentially, for the precharge period, the input signal IN may be stored in the capacitive element C1, and the first clock signal CLK1 transferred from the fourth transistor M4 or a second power voltage VSS transferred from the third transistor M3 may be applied to a control electrode of the fifth transistor M5, which is thereby turned on, such that the first power voltage VDD may be output through an output stage OUT. In other words, the output of the latch scan circuit 220 may become high during the precharge period.

During the evaluation period, i.e., the third period T43, when the first clock signal CLK1 is high and the second clock signal CLK2 is low, the first transistor M1 may be turned off so that the input signal IN is cut off, such that the third and fourth transistors M3 and M4 may also be turned off. The second transistor M2 may be turned on by a voltage, e.g., the input signal IN, stored in the capacitive element C1 during the precharge period. The second clock signal CLK2 may be provided to the output stage OIT via the turned-on second transistor M2, and the output may become low during the third period T43.

When the first and the second clock signals CLK1 and CLK2 are high, if a previous period is the precharge period, i.e., during the second period T42, the first and third transistors M1 and M3 controlled by the first clock signal CLK1 may be turned off, and the voltage stored in the capacitive element C1 may be maintained.

During the fourth period T44, the fifth transistor M5 may be turned on and the second transistor M2 may be turned off, or the fifth transistor M5 may be turned off and the second transistor M2 may be turned on. Thus, the output stage OUT may become a non-floating state.

As a result, the output stage OUT of the latch scan circuit 220 may always be maintained in the non-floating state for the first to fourth periods T41, T42, T43 and T44, thereby reducing or preventing the scan signal applied to each scan line being changed due to the coupling capacitance caused by the intersection of the scan lines and the data lines.

FIG. 5 illustrates a circuit diagram of a shift register SR, which may be used in the clock distributor CD 210 (FIG. 6) according to an embodiment of the present invention.

Referring to FIG. 5, the shift register SR may receive the base clock signal CS, a base negative clock signal CSB, a shift register input signal IN[SR], a first power voltage VDD, and the second power voltage VSS. The base clock signal CS and the base negative clock signal CSB are opposite each other, i.e., when the base clock signal CS is high, the base negative clock signal CSB is low, and vice versa. The first power voltage VDD may be higher than the second power voltage VDD.

The shift register SR may include a first PMOS switching element P1, a second PMOS switching element P2, a third PMOS switching element P3, a fourth PMOS switching element P4, a fifth PMOS switching element P5, a first NMOS switching element N1, a second NMOS switching element N2, a third NMOS switching element N3, a fourth NMOS switching element N4 and a fifth NMOS switching element N5.

The first PMOS switching element P1 may include a first electrode (drain electrode or source electrode) electrically coupled to the first power voltage VDD, a second electrode (drain electrode or source electrode) electrically coupled to the second PMOS switching element P2, and a control electrode (gate electrode) electrically coupled to the base clock signal CS. The first PMOS switching element P1 may be turned on when the base clock signal CS is low, thereby supplying the first power voltage VDD to the second PMOS switching element P2.

The second PMOS switching element P2 may include a first electrode electrically coupled to the second electrode of the first PMOS switching element P1, a second electrode electrically coupled to a first electrode of the second NMOS switching element N2 and a first node (FN), and a control electrode electrically coupled to the shift register input signal IN[SR]. The second PMOS switching element P2 may be turned on when the shift register input signal IN[SR] is low, such that, the first power voltage VDD being supplied from the first PMOS switching element P1 may be supplied to the first node FN.

The third PMOS switching element P3 may include a first electrode electrically coupled to the first power voltage VDD, a second electrode electrically coupled to the fourth PMOS switching element P4, and a control electrode electrically coupled to the base negative clock signal CSB. The third PMOS switching element P3 may be turned on when the base negative clock signal CSB is low, such that the first power voltage VDD may be supplied to the first electrode of the fourth PMOS switching element P4.

The fourth PMOS switching element P4 may include a first electrode electrically coupled to the second electrode of the third PMOS switching element P3, a second electrode electrically coupled to a first electrode of the fourth NMOS switching element N3 and the first node FN, and a control electrode electrically coupled to the shift register output signal OUT[SR]. The fourth PMOS switching element P4 may be turned on when the shift register output signal OUT[SR] is low, such that the first power voltage VDD being supplied at the third PMOS switching element P3 may be supplied to the first node FN.

The fifth PMOS switching element P5 may include a first electrode electrically coupled to the first power voltage VDD, a second electrode electrically coupled to the first electrode of the fifth NMOS switching element N5, and a control electrode electrically coupled to the first node FN. The fifth PMOS switching element P5 may be turned on when a signal input to the control electrode through the first node FN is low, such that the first power voltage VDD may be output to the shift register output signal OUT[SR].

The first NMOS switching element N1 may include a first electrode electrically coupled to the second NMOS switching element N2, a second electrode electrically coupled to the second power voltage VSS, and a control electrode electrically coupled to the base negative clock signal CSB. The first NMOS switching element N1 may be turned on when the base negative clock signal CSB is high, such that the second power voltage VSS may be supplied to the second electrode of the second NMOS switching element N2.

The second NMOS switching element N2 may include a first electrode electrically coupled to the second electrode of the PMOS switching element P2 and the first node FN, a second electrode electrically coupled to the first electrode of the first NMOS switching element N1, and a control electrode electrically coupled to the shift register input signal IN[SR]. The second NMOS switching element N2 may be turned on when the shift register input signal IN[SR] is high, such that the second power voltage VSS being supplied at the first NMOS switching element N1 may be supplied to the first node FN.

The third NMOS switching element N3 may include a first electrode electrically coupled to the fourth NMOS switching element N4, a second electrode electrically coupled to the second power voltage VSS, and a control electrode electrically coupled to the base clock signal CS. The third NMOS switching element N3 may be turned on when the base clock signal CS is high, such that the second power voltage VSS may be supplied to the second electrode of the fourth NMOS switching element N4.

The fourth NMOS switching element N4 may include a first electrode electrically coupled to the second electrode of the fourth PMOS switching element P4 and the first node FN, a second electrode electrically coupled to the first electrode of the third NMOS switching element N3, and a control electrode electrically coupled to the shift register output signal OUT[SR] and a second node (SN). The fourth NMOS switching element N4 may be turned on when the shift register output signal OUT[SR] is high, such that the second power voltage VSS being supplied at the third NMOS switching element N3 may be supplied to the first node FN.

The fifth NMOS switching element N5 may include a first electrode electrically coupled to the second electrode of the fifth PMOS switching element P5, a second electrode electrically coupled to the second power voltage VSS, and a control electrode electrically coupled to the first node FN. The fifth NMOS switching element N5 may be turned on when a signal input to the control electrode through the first node FN is high, such that the second power voltage VSS may be supplied to the shift register output signal OUT[SR].

FIG. 6 illustrates a block diagram of the clock distributor 210 according to an embodiment of the present invention. The clock distributor 210 may include the shift register SR illustrated in FIG. 5.

Referring to FIG. 6, the clock distributor CD 210 of the scan driver 200 of EL display 100 may include the shift register SR, a shift inverter S_Inv, a first switching element S1, a clock inverter Clk_Inv, a first driver 610, a second driver 620, and logic gate(s), e.g., a first NAND gate NAND1 and a second NAND gate NAND2.

The clock distributor CD 210 may generate first and second signals CLK1 and CLK2 by receiving the base clock signal CS, the initializing driving signal FLM and the first power voltage VDD.

The shift register SR, referring to the shift register SR of FIG. 5, may generate the output signal by receiving the base clock signal CS, the base negative clock signal CSB and the initializing driving signal FLM. The output signal of the shift register SR is a shifted initializing driving signal. The output signal of the shift register may be an input signal of the shift inverter S_Inv. The base clock signal CS may be transferred to the clock inverter Clk_Inv to generate the base negative clock signal CSB.

The shift inverter S_Inv may receive the output signal of the shift register SR, generate a negative output signal of the shift register SR, and supply the negative output signal of the shift register SR to the control electrode of the first switching element S1. If the output signal of the shift register SR is high, the negative output signal of the shift register is low, and vice versa.

The first switching element S1 may include a first electrode (drain electrode or source electrode) electrically coupled to the first power voltage VDD, a second electrode (drain electrode or source electrode) electrically coupled to the first and second drivers 610 and 620, and a control electrode (gate electrode) electrically coupled to the output signal terminal of the shift inverter S_Inv. The first switching element S1 may be turned on when the shift register output signal is high, thereby supplying a first power voltage VDDa to the first and second drivers 610 and 620.

The clock inverter Clk_Inv may receive the base clock signal CS to generate the base negative clock signal CSB. When the base clock signal CS is high, the base negative clock signal becomes low, and vice versa.

The first driver 610 may include a first transmission gate TM1, a second transmission gate TM2, a first inverter Inv1, and a second inverter Inv2. The first driver 610 may receive the base clock signal CS, the base negative clock signal CSB, and the initializing signal (the first power voltage VDDa supplied by the first switching element S1), and may output an output signal. The first transmission gate TM1 of the first driver 610 may receive a feedback signal from the second driver 620, i.e., a second output signal B, the base clock signal CS and the base negative clock signal CSB, and may generate an output signal of the first transmission gate TM1.

The first transmission gate TM1 may include a PMOS transistor and a NMOS transistor. The PMOS transistor may include a first electrode electrically coupled to the first electrode of the NMOS transistor, a second electrode electrically coupled to the second electrode of the NMOS transistor and a control electrode electrically coupled to the base negative clock signal CSB. The PMOS transistor may be turned on when the input signal is low, thereby outputting the input signal. The NMOS transistor may include a first electrode electrically coupled to the first electrode of the PMOS transistor, a second electrode electrically coupled to the second electrode of the PMOS transistor, and a control electrode electrically coupled to the base clock signal CS. The NMOS transistor may be turned on when the input signal is high, thereby outputting the input signal. The first transmission gate TM1 may be turned when the base clock signal CS is high and the base negative clock signal CSB is low, thereby supplying the feedback signal B to the first inverter Inv1.

The second transmission gate TM2 of the first driver 610 may generate an output signal by receiving the output signal of the second inverter Inv2, the base clock signal CS, and the base negative clock signal CSB. The second transmission gate TM1 may include a PMOS transistor and a NMOS transistor. The PMOS transistor may include a first electrode electrically coupled to the first electrode of the NMOS transistor, a second electrode electrically coupled to the second electrode of the NMOS transistor, and a control electrode electrically coupled to the base clock signal CS. The PMOS transistor may be turned on when an input signal is low, thus outputting the input signal. The NMOS transistor may include a first electrode electrically coupled to the first electrode of the PMOS transistor, a second electrode electrically coupled to the second electrode of the PMOS transistor, and a control electrode electrically coupled to the base negative clock signal CSB. The NMOS transistor may be turned on when an input signal supplied to the control electrode thereof is high, thus outputting the input signal. Thus, the second transmission gate TM2 may be turned on when the base negative clock signal CSB is high and the base clock signal CS is low, thereby supplying the output signal of the second inverter Inv2 to the first inverter Inv1. When the first transmission gate TM1 is turned on, the second transmission gate TM2 is turned off, and vice versa.

The first inverter Inv1 of the first driver 610 may receive the output signal of the first transmission gate TM1 when the base clock signal CS is high, and may receive the output signal of the second transmission gate TM2 when the base clock signal CS is low, so as to generate a first output signal A of the first driver 610.

The second inverter Inv2 of the first driver 610 may receive the first power voltage VDDa from the first switching element S1 during initial driving, may supply an inverted first power voltage signal to the second transmission gate TM2, and may receive the first output signal from the first inverter Inv1 after initial driving to output the first output signal to the second transmission gate TM2.

The second driver 620 may include a third transmission gate TM3, a fourth transmission gate TM4, a third inverter Inv3 and a fourth inverter Inv4. The second driver 620 may receive the base clock signal CS, the base negative clock signal CSB, and the initializing signal VDDa, and may output a second output signal B. The third transmission gate TM3 of the second driver 620 may receive the first power voltage VDDa, the base clock signal CS, and the base negative clock signal CSB during initial driving to generate the output signal of the third transmission gate TM3. After initial driving, the output signal of the third transmission gate TM3 may be generated by receiving the first output signal A, the base clock signal CS and the base negative clock signal CSB.

The third transmission gate TM3 may include a PMOS transistor and a NMOS transistor. The PMOS transistor may include a first electrode electrically coupled to the first electrode of NMOS transistor, a second electrode electrically coupled to the second electrode of NMOS transistor, and a control electrode electrically coupled to the base clock signal CS. The PMOS transistor may be turned on when the input signal is low, thereby outputting the input signal. The NMOS transistor may include a first electrode electrically coupled to the first electrode of the PMOS transistor, a second electrode electrically coupled to the second electrode of the PMOS transistor and a control electrode electrically coupled to the base negative clock signal CSB. The NMOS transistor may be turned on when the input signal is high, thereby outputting the input signal. The third transmission gate TM3 may be turned on when the base negative clock signal CSB is high and the base clock signal CS is low. Accordingly, the first power voltage VDD and the first output signal A may be transferred to an input of the third inverter Inv3.

The fourth transmission gate TM4 of the second driver 620 may receive the second output signal B, the base clock signal CS, and the base negative clock signal CSB, and may generate an output signal of the fourth transmission gate TM4. The fourth transmission gate TM4 may include a PMOS transistor and NMOS transistor. The PMOS transistor may include a first electrode electrically coupled to the first electrode of the NMOS transistor, a second electrode electrically coupled to the second electrode of the NMOS transistor, and a control electrode electrically coupled to the base negative clock signal CSB. The PMOS transistor may be turned on when the input signal is low, thus outputting the input signal. The NMOS transistor may include a first electrode electrically coupled to the first electrode of the PMOS transistor, a second electrode electrically coupled to the second electrode of the PMOS transistor, and a control electrode electrically coupled to the base clock signal CS. The NMOS transistor may be turned on when the input signal is high, thus outputting the input signal. The fourth transmission gate TM4 may be turned when the base clock signal CS is high and the base negative clock signal CSB is low, thus transferring the output signal (same as the second output signal of the fourth inverter Inv4) to the input signal of the third inverter Inv3. When the third transmission gate TM3 is turned on, the fourth transmission gate TM4 is turned off, and vice versa.

The third inverter Inv3 of the second driver 620 may receive the output signal of the third transmission gate TM3 when the base clock signal CS is low and receive the output signal of the fourth transmission gate TM4 when the base clock signal CS is high, and may generate a second negative output signal C of the second driver 620.

The fourth inverter Inv4 of the second driver 620 may receive the second negative output signal from the third inverter Inv3 and may generate the second output signal B. If the second output signal B is high, the second negative clock signal C becomes low, and vice versa.

The first NAND gate NAND1 may receive the base clock signal CS and the second output signal B of the second driver 620 to generate the first clock signal CLK1. The second NAND gate NAND2 may receive the base clock signal CS and the second output signal C of the second driver 620 to generate the second clock signal CLK2. The first and second signals CLK1 and CLK2 may sequentially be low signals separated by a time during which the first and second clock signals CLK1 and CLK2 overlap, i.e., are both high.

Figure 7:
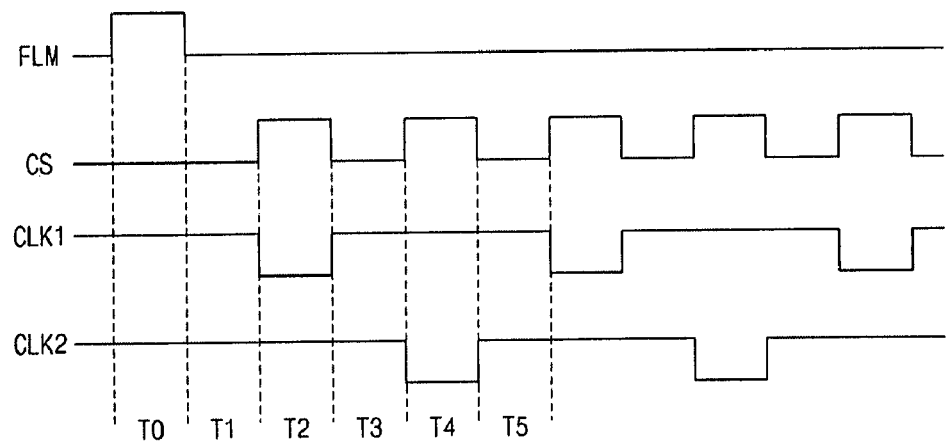
FIG. 7 illustrates a timing diagram of an operation of the clock distributor shown in FIG. 6.

FIG. 7 illustrates a timing diagram of operation of the clock distributor CD 210 illustrated in FIG. 6. An operation of the clock distributor CD 210 will be explained below.

Referring to FIG. 7, the clock distributor CD 210 of scan driver 200 may include an initializing driving period T0, a first delay period T1, a first clock signal output period T2, a second delay period T3, a second clock signal output period T4 and a third delay period T5.

During the initializing driving period T0, when the initializing driving signal FLM is high and a base clock signal CS is low, an output signal of the shift register SR may be high. The output signal may be inverted from high to low through the shift inverter S_Inv. The first switching element S1 may be turned on when the low output signal is supplied from the shift inverter S_Inv to the control electrode of the first switching element S1, thus transferring the first power voltage VDD to the first and second drivers 610 and 620. The first power voltage VDD may supply an initializing signal VDDa to the first and second drivers 610 and 620, where VDDa is an initializing signal for initially driving the first and second drivers 610 and 620.

During the initializing driving period T0, the second transmission gate TM2 may be turned when the initializing signal VDDa is high and the base clock signal CS is low. The initializing signal VDDa may be inverted from high to low through the second inverter Inv2, and may output a first output signal A from the first inverter Inv1 via the second transmission gate TM2. In other words, the input initializing signal VDDa may circulate through the first inverter Inv1, the second transmission gate TM2 and the second inverter Inv2.

During the initializing driving period T0, the third transmission gate TM3 may be turned on when the initializing signal VDDa is high and the base clock signal CS is low. The initializing signal VDDa output from the third transmission gate TM3 may be inverted from high to low through the third inverter Inv3, thus outputting a low second negative output signal C. The low second negative output signal C may be supplied to the fourth inverter Inv4, which may output a high second output signal B.

During the initializing driving period T0, the first clock signal CLK1 output by the first NAND gate NAND1 may be high when the second output signal B is high and the base clock signal CS is low. The second clock signal CLK2 output by the second NAND gate NAND2 may be high when the second negative output signal C is low and the base clock signal CS is low.

During the first delay period T1, when the initializing driving signal FLM is low and the base clock signal CS is low, the output signal of the shift register SR may be low. The output signal may be inverted from low to high through the shift inverter S_Inv. The first switching element S1 may be turned off when the high output signal is supplied to the control electrode of the first switching element S1. In other words, the initializing signal VDDa may be supplied to the first and second drivers 610 and 620 in the initializing driving period T0, but not during the first delay period T1. The second transmission gate TM2 may be turned when the base clock signal CS is low. The high first output signal A may be inverted to low through the second inverter Inv2, and may be output as a high first output signal A from the first inverter Inv1 via the second transmission gate TM2. Thus, during the first delay period T1, the first output signal A may circulate through the first inverter Inv1, the second transmission gate TM2 and the second inverter Inv2.

During the first delay period T1, the third transmission gate TM3 may be turned on when the base clock signal CS is low. The high first output signal A may be supplied to the third inverter Inv3 via the third transmission gate TM3. The third inverter Inv3 may output a low second negative output signal C and may transfer the second negative output signal C to the fourth inverter Inv4, which, in turn, may output a high second output signal B.

During the first delay period T1, the first clock signal CLK1 output by the first NAND gate NAND1 may be high when the second output signal B is high and the base clock signal CS is low. The second clock signal CLK2 output by the second NAND gate NAND2 may be high when the second negative output signal C and the base clock signal CS are low.

During the first clock signal output period T2, when the initializing driving signal FLM is low and the base clock signal CS is high, a low output signal may be output from the shift register SR. The low output signal may be inverted to high by the shift inverter S_Inv. The first switching element S1 may be turned off by the high output signal supplied to the control electrode of the first switching element S1, such that the initializing signal VDDa may be supplied to the first and second drivers 610 and 620 during the initializing driving period T0, but not during the first clock signal output period T2.

The first transmission gate TM1 may be turned on when the base clock signal CS is high. The high second output signal B received from the second driver 620 may be transferred to the first inverter Inv1 through the first transmission gate TM1 to generate a low first output signal A. The fourth transmission gate TM4 may be turned on when the base clock signal CS is low. The high second output signal B output by the second driver 620 during the first delay period T1 may be transferred to the third inverter Inv3 via the fourth transmission gate TM4. The third inverter Inv3 may output a low second negative output signal C of the low level to the fourth inverter Inv4, which, in turn, may output a high second output signal B. The high input second output signal B may circulate through the fourth transmission gate TM4, the third inverter Inv3 and the fourth inverter Inv4.

During the first clock signal output period T2, the first clock signal CLK1 output by the first NAND gate NAND1 may be low when the second output signal B and the base clock signal CS are high. The second clock signal CLK2 output by the second NAND gate NAND2 may be high when the second negative output signal C is low and the base clock signal CS is high.

During the second delay period T3, when the initializing driving signal FLM and the base clock signal CS are low, a output signal from the shift register SR may be low. The low output signal may be inverted to high by shift inverter S_Inv. The first switching element S1 may be turned off when the high output signal is supplied to the control electrode of the first switching element S1. In other words, the initializing signal VDDa may be transferred to the first and second drivers 610 and 620 during the initializing driving period T0, and not during the second delay period T3.

During the second delay period T3, the second transmission gate TM2 may be turned on when the base clock signal CS is low. The low first output signal A of supplied during the first clock signal output period T2 may be inverted to high by the second inverter Inv2. A low first output signal A may be supplied to first inverter Inv1 iva the second transmission gate TM2. Thus, the first output signal A may circulate through the first inverter Inv1, the second transmission gate TM2 and the second inverter Inv2.

During the second delay period T3, the third transmission gate TM3 may be turned on when the base clock signal CS is low. The low first output signal A may be supplied to the third inverter Inv3 via the third transmission gate TM3, which may generate the second negative output signal C. The second negative output signal C may be supplied to fourth inverter Inv4, which may generate a low second output signal B.

During the second delay period T3, the first clock signal CLK1 output by the first NAND gate NAND1 may be high when the second output signal B and the base clock signal CS are low. The second clock signal CLK2 output by the second NAND gate NAND2 may be high when the second negative output signal C is high and the base clock signal CS is low. The second delay period T3 may correspond to a time that the first and the second clock signal CLK1 and CLK2 overlap, i.e., are both high. A predetermined time interval between the output signals of each latch scan circuit may be produced by the delay period T3, thereby allowing margin for the clock skew or the delay to be assured.

During the second clock signal output period T4, when the initializing driving signal FLM is low and the base clock signal CS is high, the output signal of the shift register SR may be low. The low output signal may be output as high by shift inverter S_Inv. The first switching element S1 may be turned off when the high output signal is supplied to the control electrode of the first switching element S1. Thus, the initializing signal VDDa may be supplied to the first and second drivers 610 and 620s in the initializing driving period T0, but not during the second clock signal output period T4.

During the second clock signal output period T4, the first transmission gate TM1 may be turned on when the base clock signal CS is high. The high first output signal A may be generated when the second output signal B is low from the second driver 620 is supplied to the first inverter Inv1 via the first transmission gate TM1. The fourth transmission gate TM4 may be turned on when the base clock signal CS is low. The low second output signal B from the second driver 620 in the second delay period T3 may be transferred to the third inverter Inv3 via the fourth transmission gate TM4 to generate a high second negative output signal C. The high second negative output signal C may be inverted by the fourth inverter Inv4 to generate a low second output signal B. In other words, the input second output signal B of the low level circulates through the fourth transmission gate TM4, the third inverter Inv3 and the fourth inverter Inv4. The first clock signal CLK1 output by the first NAND gate NAND1 may be high when the second output signal B is low and the base clock signal CS is high. The second clock signal CLK2 output by the second NAND gate NAND2 may be low when the second negative output signal C and the base clock signal CS are high.

During the third delay period T5, when the initializing driving signal FLM of and the base clock signal CS are low, the output signal of the shift register SR may be low. The low output signal may be inverted to high through shift inverter S_Inv. The first switching element S1 may be turned off when the high output signal is supplied to the control electrode of the first switching element S1. Thus, the initializing signal VDDa may be supplied to the first and second drivers 610 and 620s in the initializing driving period T0, but not during the third delay period T5.

During the second clock signal output period T4, the second transmission gate TM2 may be turned on when the base clock signal CS is low. The high first output signal A supplied during the second clock signal output period T4 may be inverted to low by the second inverter Inv2. The low first output signal A may be transferred to first inverter Inv via the second transmission gate TM2 so as to output a high first output signal A. Thus, the first output signal A may circulate through the first inverter Inv1, the second transmission gate TM2 and the second inverter Inv2.

During the second clock signal output period T4, the third transmission gate TM3 may be turned on when the base clock signal CS is low. The first output signal A may be inverted to high by the third inverter via the third transmission gate TM3 and may be output the second negative output signal C. The second negative output signal C may be inverted by fourth inverter Inv4 to generate a high second output signal B.

During the second clock signal output period T4, the first clock signal CLK1 output by the first NAND gate NAND1 may be high when the second output signal B is high and the base clock signal CS is low. The second clock signal CLK2 output by the second NAND gate NAND2 may be high when the second negative output signal C and the base clock signal CS are low. The third delay period T5 may correspond to time that the high levels of the first and second clock signals CLK1 and CLK2 overlap. A predetermined time interval between the output signals of each latch scan circuit may be produced by the delay period T5, thereby allowing margin for the clock skew or the delay to be assured.

EXAMPLES OF EL ELEMENTS

An organic electroluminescent (EL) element to be used in the EL display according to embodiments may include an anode, an organic layer and a cathode. The organic layer may include an emitting layer (EML) for emitting light by meeting electrons with holes to form excitons, an electron transport layer (ETL) for transporting the electrons and a hole transport layer (HTL) for transporting holes. An electron injecting layer (EIL) for injecting the electrons may be formed on one side of the electron transport layer, and a hole injecting layer (HIL) for injecting holes may be formed on one side of the HTL. A phosphorescent organic electroluminescence element may be formed selectively between the EML and the ETL, and an electron blocking layer (EBL) may be formed selectively between the EML and the HTL.

A slim organic EL element having a decreased thickness may be realized by providing two functions within a single layer. For example, the organic layer may be selectively formed of a hole injection transport layer (HITL) that simultaneously forms the HIL and the HTL, and an electron injection transport layer (EITL) that simultaneously forms the EIL and the ETL. The slim organic EL element may be used to increase light emission efficiency.

Buffer layers may be formed between the anode, the organic layer and the cathode. The buffer layers may be classified as an electron buffer layer (EBL) for buffering the electrons and a hole buffer layer (HBL) for buffering the holes. An electron buffer layer may be selectively formed between the cathode and the EIL, and may replace the EIL. A stack structure of the organic layer may include EML/ETL/EBL/cathode. The hole buffer layer may be selectively formed between the anode and HIL, and may replace the HIL. A stack structure of the organic layer may be anode/HBL/HTL/EML.

Any of the stack structures of the following examples of stack structures may be employed in embodiments of the present invention. For example, a normal stack structure may include: 1) anode/HIL/HTL/EML/ETL/EIL/cathode; 2) anode/HBL/HIL/HTL/EML/ETL/EIL/cathode; 3) anode/HIL/HTL/EML/ETL/EIL/EBL/cathode; 4) anode/hole buffer layer/HIL/HTL/EML/ETL/EIL/EBL/cathode; 5) anode/HIL/HBL/HTL/EML/ETL/EIL/cathode; and 6) anode/HIL/HTL/EML/ETL/EBL/EIL/cathode. For example, a normal slim structure may include: 1) anode/HITL/EML/ETL/EIL/cathode; 2) anode/HBL/HITL/EML/ETL/EIL/cathode; 3) anode/HIL/HTL/EML/EITL/EBL/cathode; 4) anode/HBL/HTL/EML/EITL/EBL/cathode; 5) anode/HITL/HBL/EML/ETL/EIL/cathode; and 6) anode/HIL/HTL/HBL/EML/ETL/EIL/EBL/EITL/cathode. For example, an inverted stack structure may include: 1) cathode/EIL/ETL/EML/HTL/HIL/anode; 2) cathode/EIL/ETL/EMl/HTL/HIL/HBL/anode; 3) cathode/EBL/EIL/ETL/EML/HTL/HIL/cathode; 4) cathode/electron buffer layer/EIL/ETL/EML/HTL/HBL/anode; 5) cathode/EIL/ETL/EML/HTL/HBL/HIL/anode; and 6) cathode/EIL/EBL/ETL/EML/HTL/EIL/anode. For example, an inverted slim structure may include: 1) cathode/EIL/ETL/EML/HITL/anode; 2) cathode/EIL/ETL/EML/HITL/HBL/anode; 3) cathode/EBL/EITL/EML/HTL/HIL/cathode; 4) cathode/EBL/EITL/EML/HTL/HBL/anode; 5) cathode/EIL/ETL/EML/HBL/HITL/anode; and 6) cathode/EITL/EBL/EML/HTL/EIL/anode.

As described above, a driving technique of the organic electroluminescence element may be classified as a passive matrix (PM) technique and an active matrix (AM) technique. The PM matrix technique may include an anode and a cathode orthogonal to each other and may be driven by selecting a line. Accordingly, a production process is simple and investment cost is decreased, but consumption current is large in implementing a large screen. The AM technique may include an active device such as the thin film transistor (TFT) and a capacitance device on each pixel, thereby having low consumption current, high image quality and life.

As described above, the AM technique may essentially include a pixel circuit based on the organic EL element and the TFT. Crystallization of the TFT of the organic EL display may include using an excimer laser crystallization (ELA) using an excimer laser, a metal induced crystallization (MIC) using a promoting material, and a solid phase crystallization (SPC). Additionally, the crystallization of the TFT of the organic electroluminescence display may include a sequential lateral solidification (SLS) using a mask in the conventional excimer-laser crystallization method. Also a crystallization method for crystallizing micro silicon having grain size between an amorphous silicon (a-Si) and poly silicon mainly includes a thermal crystallization method and a laser crystallization method.

"Micro silicon" as used herein is silicon having a grain size that is small compared with poly-silicon, e.g., is between about 1 nm to about 100 nm. Micro silicon may have an electron mobility between about 1 to below about 50, and a hole mobility between about 0.01 to below about 0.2. Accordingly, electrons in the micro silicon may not be affected by the projecting part between grains, since the projecting part is small.

The thermal crystallization method for crystallizing the micro silicon may include a method of obtaining crystallization structure while depositing amorphous silicon and a reheating method.

The laser crystallization method for crystallizing the micro silicon may deposit a-Si using a chemical vapor deposition (CVD) method and crystallizes using the laser, e.g., a diode laser. The laser may output light at a red wavelength, e.g., 800 nm. The red wavelength may aid in uniformly crystallizing the micro silicon grain.

Among the methods for crystallizing a TFT into the poly silicon, excimer laser crystallization has been mainly used. Excimer laser crystallization may use a crystallization method of a conventional poly liquid crystal display itself, and a process is simple. Further, the technology development of the excimer laser crystallization has been fully developed.

The metal induced crystallization (MIC) is one of methods capable of crystallizing at a low temperature without using the excimer laser. The metal induced crystallization (MIC) may deposit or spin-coat a catalyst metal, such as Ni, Co, Pd and Ir, so the catalyst metal may directly penetrate a surface of the amorphous silicon (a-Si) and crystallize while a phase of the amorphous silicon is changed. The metal induced crystallization (MIC) may be crystallized at the low temperature.

Further, the metal induced crystallization (MIC) may maximally restrain a contaminant, such as nickel-silicide, on a specific region of the TFT using a mask, when a metal layer is formed on the surface of the amorphous silicon. This metal induced crystallization is referred to as a metal induced lateral crystallization (MILC). The mask of the metal induced crystallization (MIC) may be a shadow mask. The shadow mask may be a line-type mask or a dot type mask.

Further, the metal induced crystallization may be a metal induced crystallization with capping layer (MICC), where a capping layer may be inserted before the metal catalyst layer is deposited or spin-coated on the surface of the amorphous silicon, so that a catalytic amount of the metal induced to the amorphous silicon is controlled. The capping layer may be a silicon nitride film. The catalytic amount of the metal induced from the metal catalyst layer to the amorphous silicon becomes different according to thickness of the silicon nitride film. The metal catalyst being induced into the silicon nitride film may be wholly formed on the silicon nitride film, and selectively formed using the shadow mask. The amorphous silicon is crystallized into the poly silicon by the metal catalyst layer and then the capping layer can be selectively removed. The capping layer may be removed using a wet etching or a dry etching. Additionally, after the poly silicon is formed, a gate insulation film may be formed and then a gate electrode may be formed on the gate insulation film. An interlayer insulation film may be formed on the gate electrode. After forming a via-hole on the interlayer insulation film, impurities are injected into the poly silicon crystallized through the via-hole so as to enable the metal catalytic impurities in the inside of the poly silicon to be removed. This is referred to as "gettering process". The gettering process includes a process of injecting the impurities and a heating process of heating the thin film transistor at a low temperature. The gettering process may provide a good quality TFT.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A scan driver, comprising:
   a shift register;
   a first signal processor adapted to receive an initializing signal, a base clock signal, a base negative clock signal and a feedback signal, and to generate a first output signal,
   wherein the first signal processor includes a first transmission gate adapted to receive the base clock signal and the base negative clock signal and to transfer the feedback signal to a first inverter, a second transmission gate adapted to receive the base clock signal and the base negative clock signal and to transfer the output signal of a second inverter to the first inverter, the first inverter adapted to receive the output signal of the first and the second transmission gates and to generate the first output signal, the second inverter adapted to invert the first output signal and to transfer an inverted first output signal to the second transmission gate;
   a second signal processor adapted to receive the initializing signal, the first output signal, the base clock signal and the base negative clock signal, and to generate a second output signal and a second negative output signal;
   a first logic gate adapted to receive the base clock signal and the second output signal, and to generate a first clock signal; and
   a second logic gate adapted to receive the base clock signal and the second negative output signal, and to generate a second clock signal.

2. The scan driver as claimed in claim 1, further comprising a first switching element, the first switching element being electrically coupled to a negative output signal of the shift register via a control electrode, the first switching element being adapted to supply a first power voltage to the first and second signal processors.

3. The scan driver as claimed in claim 1, further comprising a shift inverter adapted to receive the output signal of shift register and to output the negative output signal of the shift register.

4. The scan driver as claimed in claim 1, wherein the first power voltage is the initializing signal supplied to the first signal processor and the second signal processor.

5. The scan driver as claimed in claim 1, wherein the shift register is adapted to receive the base clock signal, the base negative clock signal, and the initializing signal, and to output an output signal of the shift register.

6. The scan driver as claimed in claim 1, wherein the initializing signal is input to the second inverter.

7. The scan driver as claimed in claim 1, wherein the feedback signal is the second output signal.

8. The scan driver as claimed in claim 1, wherein the first transmission gate is on when the base clock signal is high.

9. The scan driver as claimed in claim 1, wherein the second transmission gate is on when the base clock signal is low.

10. The scan driver as claimed in claim 1, wherein the first and the second clock signals are input to a latch scan circuit.

11. The scan driver as claimed in claim 10, wherein the latch scan circuit comprises:
    first through fifth transistors, wherein:
    the first transistor is adapted to transfer an input signal of the latch scan circuit to control electrodes of the second and fourth transistors in accordance with the first clock signal;
    the second transistor is adapted to transfer the second clock signal to an output signal of the latch scan circuit in accordance with an output signal of the first transistor;
    the third transistor adapted to transfer a second power voltage to the fifth transistor in accordance with the first clock signal;
    the fourth transistor is adapted to transfer the first clock signal to a control electrode of the fifth transistor in accordance with an output signal of the first transistor; and
    the fifth transistor is adapted to transfer a first power voltage to the output signal of the latch scan driving circuit in accordance with outputs of the third and the fourth transistors.

12. The scan driver as claimed in claim 10, wherein the output signal of the latch scan circuit is a scan signal transmitted to a pixel circuit.

13. The scan driver as claimed in claim 1, wherein the shift register comprises:
    a first PMOS switching element adapted to supply a first power voltage in accordance with the base clock signal;
    a second PMOS switching element adapted to supply the first power voltage from the first PMOS switching element to a first node in accordance with a shift register input signal;

a first NMOS switching element adapted to supply a second power voltage in accordance with the base negative clock signal;

a second NMOS switching element adapted to supply the second power voltage from the first NMOS switching element to the first node in accordance with the shift register input signal;

a third PMOS switching element adapted to supply the first power voltage in accordance with the base negative clock signal;

a third NMOS switching element adapted to supply the second power voltage in accordance with the base clock signal;

a second node between a fourth PMOS switching element and a fourth NMOS switching element, the fourth PMOS switching element being adapted to transfer the first power voltage from the third PMOS switching element to the first node in accordance with a signal at the second node, and the fourth NMOS switching element being adapted to transfer the second power voltage from the third NMOS switching element to the first node in accordance with the signal at the second node;

a fifth PMOS switching element adapted to supply the first power voltage to the second node in accordance with a signal at the first node; and a fifth NMOS switching element adapted to supply the second power voltage to the second node in accordance with the signal at the first node.

14. The scan driver as claimed in claim 13, wherein the second node is an output signal of the shift register.

15. The scan driver of claim 1, further comprising:
a clock inverter receiving the primitive clock signal so as to generate the primitive negative clock signal.

16. An electroluminescence display comprising the scan driver as claimed in claim 1.

17. A scan driver, comprising:
a shift register;
a first signal processor adapted to receive an initializing signal, a base clock signal, a base negative clock signal and a feedback signal, and to generate a first output signal;

a second signal processor adapted to receive the initializing signal, the first output signal, the base clock signal and the base negative clock signal, and to generate a second output signal and a second negative output signal;

a first logic gate adapted to receive the base clock signal and the second output signal, and to generate a first clock signal; and a second logic gate adapted to receive the base clock signal and the second negative output signal, and to generate a second clock signal, wherein the second signal processor includes a third transmission gate adapted to receive the base clock signal and the base negative clock signal, and to transfer the first output signal to a third inverter, a fourth transmission gate adapted to receive the base clock signal and the base negative clock signal, and to transfer the feedback signal to the third inverter, the third inverter adapted to receive the output signal of the third and the fourth transmission gate, and to generate the second negative output signal, and the fourth inverter adapted to receive the second negative output signal and to generate the second output signal.

18. The scan driver as claimed in claim 17, wherein the initializing signal is an input signal of the third transmission gate.

19. The scan driver as claimed in claim 17, wherein the feedback signal is the second output signal.

20. The scan driver as claimed in claim 17, wherein the third transmission gate is on when the base clock signal is high.

21. The scan driver as claimed in claim 17, wherein the fourth transmission gate is on when the base clock signal is low.

22. An electroluminescence display comprising the scan driver as claimed in claim 17.

* * * * *